United States Patent [19]

Weresch

[11] 4,371,012

[45] Feb. 1, 1983

[54] APPARATUS FOR WORKING LEADS OF ELECTRICAL COMPONENTS

[76] Inventor: Thomas Weresch, Greschbachstr. 19, D-7500 Karlsruhe 41, Fed. Rep. of Germany

[21] Appl. No.: 204,513

[22] Filed: Nov. 6, 1980

[30] Foreign Application Priority Data

Nov. 6, 1979 [DE] Fed. Rep. of Germany ....... 2944684

[51] Int. Cl.³ .............................................. B21F 1/00
[52] U.S. Cl. ...................................... 140/105; 72/184
[58] Field of Search ................ 140/71 R, 105; 72/184

[56] References Cited

U.S. PATENT DOCUMENTS

| | | | |
|---|---|---|---|
| 3,071,166 | 1/1963 | Gutbier | 140/71 R |
| 3,945,408 | 3/1976 | Halligan | 140/105 |
| 4,020,880 | 5/1977 | Heller et al. | 140/105 |

Primary Examiner—Lowell A. Larson
Attorney, Agent, or Firm—Antonelli, Terry & Wands

[57] ABSTRACT

An apparatus for working on the leads of electrical components has a component inlet or supply unit taking the form, for example, of a chute with a guideway opening, or with an inlet for the supply of components fixed to belts or paper tapes. The apparatus furthermore has two tools, each placed on a tool support. The two tools are moved together for forming the component leads, the leads being placed in the path of the tools. The tools are supported on a carriage, which may be moved in a direction parallel to the direction of input of the components. Furthermore, the tools are moved together in timed relation to input of the components and the working motion of the carriage. In the case of such an apparatus, for making a better design of the working steps and events taking place on operation as the apparatus is moved, and for making adjustment more readily possible, each tool support has a guide face parallel to the direction of working motion, the length of each guide face being at least equal to the length of the working motion, driving levers, which are turningly supported on a base-plate, resting against the guide faces. The driving levers are worked by at least one tool shutting cam powered by a driving motor. Such an apparatus may be used for general processing of component leads and, more specially cutting to length, bending or kinking such leads on transistors, capacitors etc.

17 Claims, 2 Drawing Figures

APPARATUS FOR WORKING LEADS OF ELECTRICAL COMPONENTS

BACKGROUND OF THE INVENTION (i) Field to which the invention relates

The present invention is with respect to a system for working leads of electrical components, having an inlet unit with a guideway and fixedly supported on a base, two tools designed for operation with said inlet unit and powered by a driving motor, the tools each being positioned on a different one of two tool supports so that they may be moved towards each other for bending and kinking the leads of the said components between them, the leads running into the working path of the tools, which are supported on a carriage designed for a backward and forward working motion, parallel to the inlet unit's guideway and which are able to be moved towards each other for shutting in a direction normal to the inlet direction of the components and in timed relation to the working motion of said carriage. In connection with this apparatus, the wording "supply path" is taken to be the path of the components as supplied by the inlet unit into the range of motion of the tools.

(ii) The prior art

Electrical components are generally produced with more or less straight leads which have to be bent and kinked for wiring electrical circuits and for being electrically joined. Generally, such leads have to be cut to a desired length by the user. Such operations are generally simple in the case of cylindrical components with leads sticking out of their opposite end faces, because the leads are generally bent in a single direction and are kinked in the same way. For this purpose, apparatus has been put forward in the past, see the German Offenlegungsschrift No. 2,400,307, in which the components are transported by having their two leads taken up in spaces between the teeth of one or more pairs of toothed transport wheels, used for presenting the components to the bending and cutting tool.

On the other hand, the present invention is with respect to the processing or working of components whose leads are not placed sticking out from opposite ends of the body of the component but come out of it side-by-side on one side of the component or have been bent to one side of the component body in an earlier stage of processing. Because of their unsymmetrical form, such components may not readily be smoothly and continuously transported and presented to the processing stations. Furthermore, the leads have to be bent and kinked in different directions.

In one apparatus of the sort noted at the start of the present specification (see German Offenlegungsschrift No. 2,920,059), the components are moved out of a supply box, for example by way of a normal vibratory conveyer, to an inlet unit having a chute, by which they are then presented to the tools, the chute ending at the position at which the tools come into operation. A compound motion of the tools is produced, such motion taking the form of a shutting motion normal to the length of the opening of the chute and, at the same time, a working motion taking place in the direction of, or towards, the chute. The shutting and working parts of the compound motion take place at the same time, in timed relation to each other, as a backward and forward periodic motion. At the time of the shutting motion, the leads of the components are gripped by the tools, worked or processed and then freed again, while the working motion is responsible for taking the components from the chute and handing them over to an output point, the working of the leads taking place at the time of this forwardly-directed part of the compound working motion. Driving of the carriage for producing the working motion takes places by way of an eccentric and pitman, by a driving cam and a follower roller or the like on the carriage or the like, the necessary power coming from the driving motor. The shutting motion of the tools is produced, in the case of this apparatus (forming the starting point of the present invention) from the working motion because the driving fingers, joined with the tool support, are guided, in each case, in a double-acting cam, that is to say a cam in which the follower is run in a groove.

While it is possible to say that this form of apparatus, forming the starting point of the present invention, has gone down well in the industry, it has turned out that, in general use, producing the shutting motion from the working motion as noted is responsible for serious shortcomings. On the one hand, very exact adjustment is necessary to make certain that the tools are controlled and powered in the desired way smoothly, while, on the other hand, on use in the trade, it is necessary, in the case of such apparatus, for the shutting motion to undergo exact adjustment with respect to the length of the motion and the middle position of the tools in the shut position. Such adjustment is necessary, for example, for exactly producing the desired kink form, or, on changing the tools, for retooling, and other purposes. Adjustment of the shutting motion is still, generally speaking, complex in the case of the apparatus noted, taken as the starting point by my present invention.

SHORT OUTLINE OF THE INVENTION

One purpose of the invention is that of making such a further development of an apparatus of the sort noted that the shutting motion of the tools may take place under all conditions in the desired way and quite smoothly or continuously and, furthermore, with the chance of simple and exact adjustment.

For effecting this and other purposes, in the invention each tool support has a guide face, parallel to said working motion of the carriage, the length of the guide faces-measured in the direction of the working motion-being at least equal to the size of the working motion. Furthermore, the apparatus has two levers, which are turningly supported on the base plate. Each one of these levers is designed for acting against a different one of the guide faces and there is furthermore at least one shutting cam, designed to be turned by the motor for moving the levers. The apparatus of the present invention may be used in connection with different designs of inlet units for guiding the components. For example, the inlet or supply unit may, in a known way, take the form of a chute with a guideway opening through which the leads of the components are threaded. On the other hand, the guiding inlet unit may take the form of a system for transporting a belt or paper strip, to which the components are fixed and with which they are transported.

The driving levers may take the form of single-armed or two-armed levers and are designed for running against, more specially, not only the guide faces, but furthermore the shutting cam or cams, by way of roller followers (for example in the form of the outer race ring of a rolling element bearing).

In the invention it is possible for the shutting and working motions to be produced by the power of a single driving motor. However, mechanically, these two forms of motion are separate. The working motion of the carriage is produced by the driving motor in the way noted. The driving at the same time of the shutting cam by the driving motor makes possible the necessary timing in step of the working and shutting motions. By the use of a shutting cam or cams and levers, it is possible to make certain that the form of the shutting motion may be adjusted to take place in the best, desired way, without being dependent on the working motion. The rest of the shutting motion in relation to the working motion takes place by a representative design of the form of the cams used for producing the working and shutting motions, and of the guide faces on the tool supports, generally within a full range of adjustment as may be desired by the user. Exact and separate adjustment of the tools with respect to the length of their motion and the middle or center position in the shut condition may be undertaken in a simple way by changing the point at which the levers come up against the shutting cam and/or the guide faces.

The driving motor will generally be one producing a turning motion, although this is not necessarily so, it being readily possible for the apparatus of the invention to be powered by a linear motor, for example in the form of a cylinder and piston system, in the case of which the driving cams may be joined, for example, with the piston rod.

The guide faces may be placed so as to be facing away from each other and from the guideway, a shutting spring being used for forcing the tool supports together, such a spring furthermore having to give the necessary force for working the leads. For this reason, it is best if the guide faces are turned facing away from the guideway and if the tool supports are acted upon by an opening spring, forcing them against the levers, the force needed for bending the leads being supplied by way of the levers from the driving motor. It is furthermore possible to have a positive driving system in such a way that the tool supports are guided not only on opening, but furthermore on shutting positively (that is to say not simply by spring force) by the levers. In every case, it is best to make use of a system in which the tool supports are each guided in a carriage guide, normal to the working motion.

For driving the two levers, using power coming from the driving motor, a number of different systems will be possible, the observations now to be made on this point having in mind, more generally, a driving system with turning parts. In fact, the levers may be moved by a common lever driving cam with a diametral plane of symmetry running in the axial direction or, putting it differently, having a two-ordered radial symmetry, so that, on each turn of the cam, two working motions will be produced. The cam for producing the working motion may, in this case, be made symmetrical about a diametral plane running in an axial direction, this cam then being coaxial to the lever driving cam, or the cam, for producing the working motion, may be powered by way of change-speed gearing. As part of a further possible design, the levers may be separately moved by their own separate cams and, in this case, the lever driving cam will be joined together and with the driving shaft of the driving motor coaxially with respect to a driving motion cam for driving the carriage.

For adjustment of the shutting motion with respect to the length of the motion and its middle position under the line of guided motion of the tools, it is best for the points at which the levers come against the guide faces and/or the shutting cams to be able to be adjusted-for example by a system such that the levers have adjustment screws on them for resting against the faces in question. Such adjustment screws on the levers are, however, generally speaking, hard to get at from the outside and in place of such a system, it is best to make use of a simpler and more readily got at adjustment system, which, in the invention is made possible because the levers are bearinged on a bearing lever on the base-plate and which, itself, may be turned for adjustment. On turning the bearing levers there is a representative change in position of the bearing axes of the levers so that there is a change or adjustment in the position at which the levers come up against the guide faces or cam faces. The operation or adjustment of the bearing levers may be undertaken in a simple way using adjustment screws coming up against back-stops. Special measures for keeping in position the bearing levers (by springs for use with the adjustment screws, lockscrews or the like) are possible but, however, as a general rule will not be necessary, because the bearing levers are well kept in position by shutting or opening springs acting on the tool supports.

On working or processing the leads by bending and kinking, there is the danger, if no special steps are taken, of the leads' being worked loose in the component body because of the pulling forces acting on the leads. Such damage may be stopped by gripping the leads, when they are being worked, so that the leads are freed of any pulling effect. For this purpose, over the two tools there is, in the one case, a keeper, and, in the other case, a rest or opposite keeper, placed right under the body of the component, for gripping the leads between them. The keeper and the rest are supported on the tool or tool support in question so that they may be moved to a limited extent against the force of a spring, the design being such that the tools are firstly only shut to such a degree that the keeper and rest come up against each other, gripping the leads between them and it is only after this has been done that the tools are moved into the complete shut position. For this purpose, in the invention, the guide faces and/or the lever driving cams are so designed that in the (top) dead center position nearest the chute for the components, of the working motion, the shutting motion takes place till the gripping parts (that is to say the keeper and rest) have been moved together.

The base-plate, on which the driving motor and the carriage guide are placed, is best so supported on the machine frame that it may be moved in the direction of the working motion in relation to the inlet unit.

This makes possible adjustment of the top dead center position of the working motion, in which the components are taken up by the tools, to undergo exact positioning to be fully in line with the position at which the components are handed over. In the case of one form of the apparatus with an inlet unit having a chute for the components, the system is such that the shutting of the tools only takes place after the components have been taken over from the chute. It will be seen that, necessarily with such a design, the working motion will go furthermore than the chute in the direction of motion of the components through the apparatus. The component which is furthest forward and which is to be handed over, will be kept in position, for example by a spring, in the chute so that it will certainly be kept in position till it is handed over to the tools. For this purpose, it is best to make use of a door at the chute, which takes up a position, in each case, behind the component which is furthest to the front, the door being able to be moved into its position in the inlet unit by way of an elastically giving driving part for moving, by way of one of the tools, the door into the chute before the dead center point of the working motion nearest the chute. This makes certain that on the component being handed over and taken from the chute, the operation of the apparatus will be completely regular without any uncontrolled motion of the different parts. The door may be moved back automatically by a spring as soon as the tools have been moved back clear of the chute after handing over the component.

In a further useful development of the invention, guide rails are fixed to the chute, the rails running out therefrom to the two sides of a line continuing the guideway and over the tools and the grippers to positions near the tools when moved. Such guide rails are firstly responsible for a sideways guiding of the components and secondly have the effect of ejectors at the same time, by which the components, after bending and kinking, are moved clear of the tools when the tools are opened.

BRIEF DESCRIPTION OF THE DRAWINGS

An account will now be given of only one working example of the present invention to be seen in the figures.

DETAILED ACCOUNT OF WORKING EXAMPLE OF THE INVENTION

Figure 1:
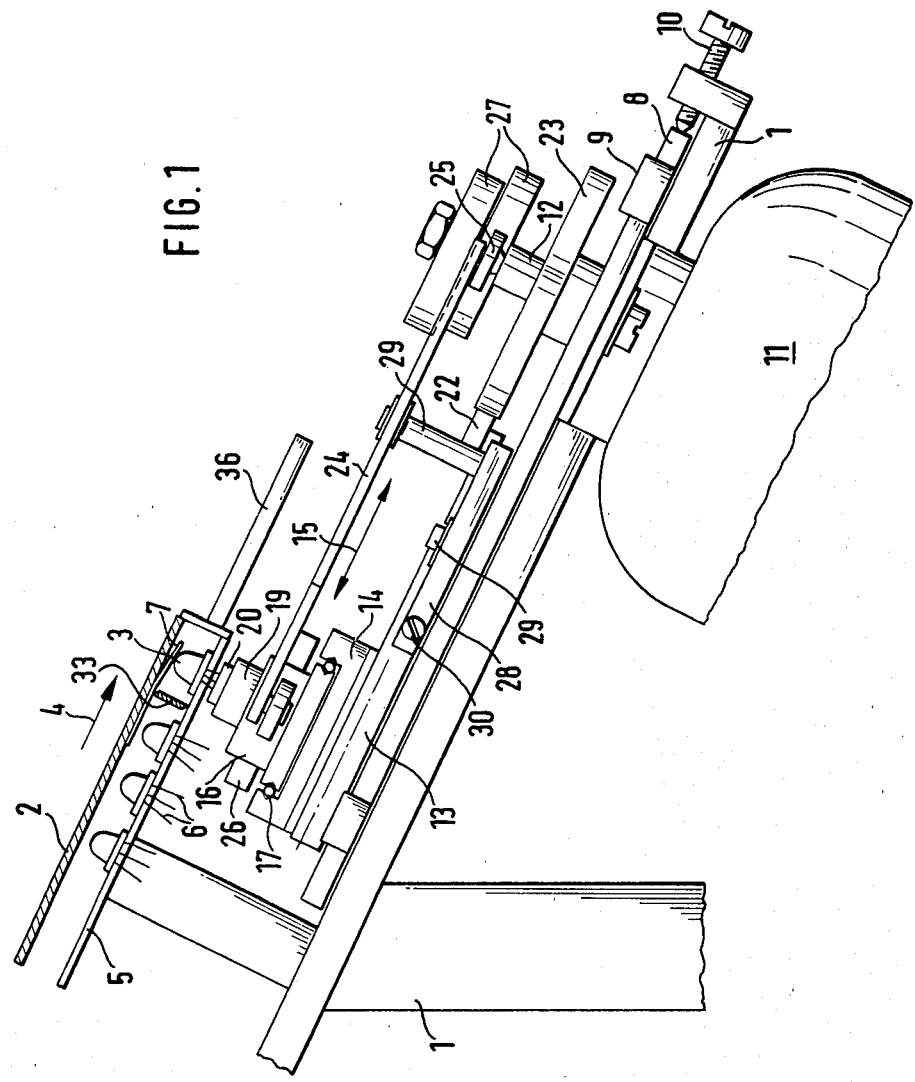
FIG. 1 is a view of an apparatus for bending, kinking and cutting to length the leads of electrical components, as seen from the side.
Figure 2:
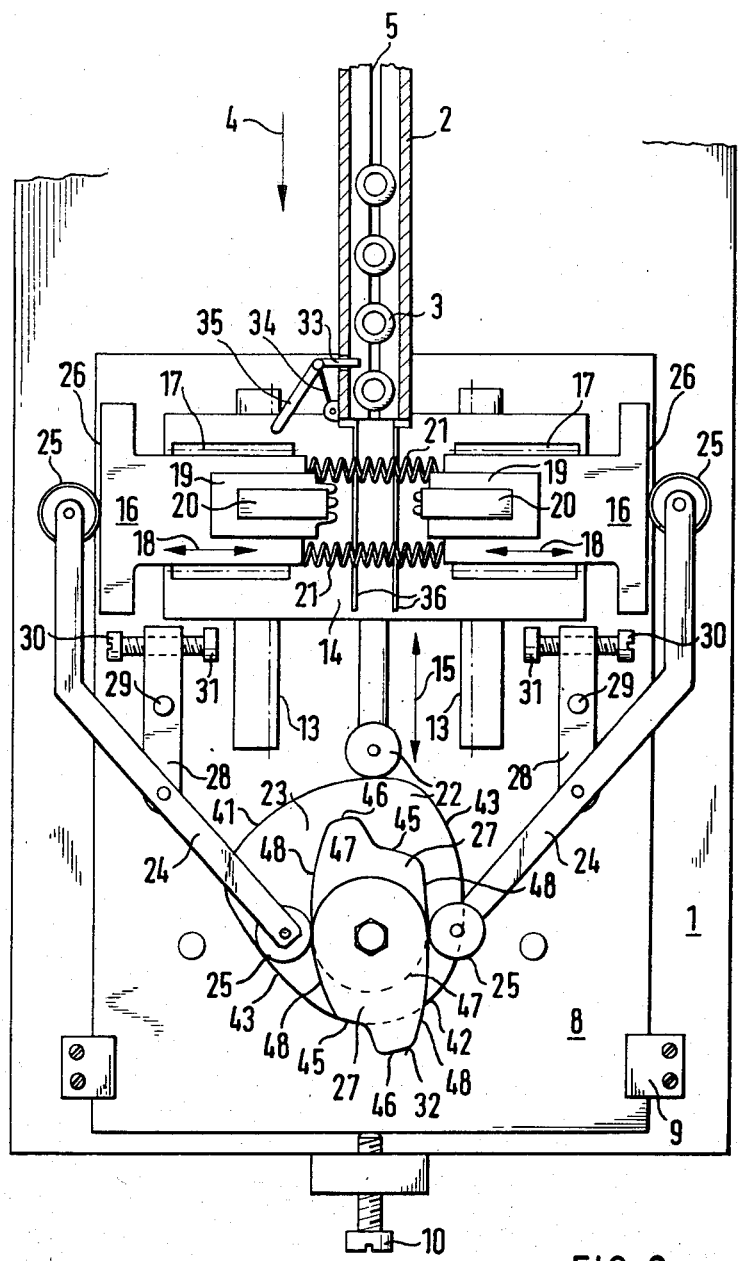
FIG. 2 is a view looking down onto the apparatus of FIG. 1.

The apparatus to be seen in FIGS. 1 and 2 for the working and, more specially, the bending, kinking and cutting to length of leads of electrical components has a machine frame 1, on which a chute 2, taking the form of an inlet unit, is fixed. Chute 2 is designed as a pipe, transistors 3 being run into chute 2 from a vibratory conveyer (not figured) or vibratory pot, the transistors moving in direction 4. On the lower side of chute 2 there is a guideway 5 through which leads 6 of transistors 3 are run out downwards. The assembly planes of machine frame 1 and chute 2 are parallel to each other and are at an angle sloping downwards in the direction 4 in which the transistors are moved through the apparatus so that transistors 3 are moved to the outlet of chute 2 under their own weight, at which point they are springingly stopped and positioned by friction and by a spring 7, placed on the top side of chute 2.

Over the machine frame 1, a base-plate 8 is positioned, which is guided in a sideways direction by stop plates 9 so that it may be moved in the direction 4 in relation to machine frame 1 and, for this reason, to chute 2. At the lower end of the machine frame 1, that is to say at the end furthest along the path of the components being moved in direction 4 through the apparatus, an adjustment screw 10 is placed for adjustment of the position of base-plate 8 in relation to chute 2, base-plate 8 resting against adjustment screw 10 under its own weight. A driving motor 11 is fixed to the lower side of base-plate 8 by wing plates and screws, from which point the body of motor 11 will be seen running downwards through an opening in machine frame 1, the motor's driving shaft 12 being turned when the said motor is turned on.

On the top side of base-plate 8, a carriage 14 is supported by way of ball guides 13 so that carriage 14 may be moved in a direction parallel to the direction 4 of component motion through the apparatus. The backward and forward motion of carriage 14 in the direction of guides 13 is arrowed 15 and named, in the account of the invention, the "working motion". On the top side of carriage 14, tool supports 16 are placed on the two sides of, and past, guideway 5. These tool supports 16 are, themselves, supported by straight ball guides 17, normal to component direction 4, so that they may be moved. In this case foward motion of the tool supports 16 in the direction of guides 17, is, in the account of the present invention, named the "shutting motion 18". At the sides, nearest together, of tool supports 16, tools 19 are fixed in position, which, when shut, have the function of bending and kinking the leads 6 of transistors 3 in the desired form. Furthermore, the apparatus has cutting tools, although these are not figured, with which the leads 6 may be cut down to the desired length. The cutting tools are placed under tools 19 and so placed that cutting by them will only be started after bending and kinking and so that the leads will not be made any shorter later by the bending and kinking operation. Over tools 19, there is, in each case, a gripper 20, taking the form in one case of a keeper and in the other case of a rest, such grippers having the function of stopping undesired pulling forces from taking effect on the component bodies. The grippers 20 are movingly supported, in each case, on the tool in question, that is to say so as to make a certain idle motion possible and acted upon by a spring (not figured) on the tool 19 or on the tool support 16. The lead grippers are so designed that the leads 6 are gripped by them before the tools 19 are shut. Between tool supports 16, two compression springs 21 are placed, for forcing tool supports 16 in an outward direction.

At the end of the apparatus which is to the front of the direction 4 of component motion, that is to say near the driving shaft 12 there is a tailpiece on carriage 14, such tailpiece having a follower roller 22, taking the form of the outer race ring of a ball bearing. Follower roller 22 is kept by the system's weight against a working cam 23, which is keyed on driving shaft 12 and which is responsible, on being turned by the driving motor 11, for producing the working motion of carriage 14.

On the top side of base-plate 8 there are furthermore two two-armed levers 24, each having at its two ends follower rollers 25, which, again, take the form of the outer race rings of ball bearings. Levers 24 are designed in the present working example so that, in each case, the top arms with follower rollers 25 come up against guide faces 26, which are placed on the outer sides of tool supports 16, furthest from chute 2. The guide faces 26 have such a length and are so placed that, in each stage of the working motion 15, follower rollers 25 will be resting against guide faces 26. In the present working example, the guide faces 26 are flat and parallel to the component motion direction 4. The levers 24 have their follower rollers 25, placed at their other ends, running against, in each case, a tool shutting cam 27, which, as well, is keyed on driving shaft 12 of the driving motor 11. By way of tool shutting cams 27, on turning driving shaft 12, the tool supports 16 are shuttingly moved in step with the working motion 15.

In the working example to be seen here, the working cam 23 is so designed that it has a part 41 of great diameter and a part 42, generally opposite to it along a line passing through the axis of rotation, of smaller diameter. The two cam face parts 41 and 42 are joined together by less curved parts 43 of changing diameter. The part 41 of greater diameter is, in this respect, responsible, by way of follower roller 22 and the tailpiece on carriage 14, for moving the carriage upwards till the tools 16 are at the level of the lowermost component 3 so that the same may be gripped for being worked on by tools 16. Part 42 with a smaller diameter of the working cam 23 will come clear of the follower roller, so freeing the carriage, with the outcome that the carriage may be slippingly moved downwards, with tools 16 into a lower position, in which it is lined up with a component takeup box (not figured) so that, on the component 3 in question being freed by tools 16, the component (in the present case transistor 3) may be dropped into the said takeup box.

In the working example of figures there are furthermore two shutting cams 27, one for a different one of tools 16, the cams being separately followed by follower rollers 25 of the two levers 24. Each tool shutting cam 27 firstly has a dwell part 45 of a relatively great diameter, after which there is directly (in the direction of operation) a narrow process part 46, whose diameter is a little greater. In the working example figured, the direction of turning of cams 23 and 27 is clockwise so that when the dwell part 45 is pointing upwards, the processing part 46 of the cam face will be to the left of said dwell part 45, the last-named having the function of moving grippers 20 up against leads 6 of transistors 3 so that the transistors are then supported by grippers 20. As the reader will see from FIG. 2, cam face parts 45 take effect on follower rollers 25 when part 41 of the working cam 23 is still keeping carriage 14, by way of follower rollers 20, in its upper position.

The working part 46 of each tool shutting cam 27, which has a somewhat greater diameter than the dwell part 45, has the effect, because of its greater diameter, of forcing the follower roller 25, resting against it, somewhat further outwards so that the tool supports 16 are moved or forced together even further. For this reason, then the two processing tools 19 are forced together even further so that the leads 6 of transistors 3 are then worked on and, more specially, bent and kinked. As may be seen from FIG. 2, when the processing part 46 is acting on its follower roller 25, the working cam 23 will have got to such a position that follower roller 22 will no longer be being acted upon by cam face part 41 and the roller 22 will now in fact be resting on cam face part with a decreasing radius. The processing of leads 6 does not, for this reason, take place in the uppermost position of carriage 14 but in fact when carriage 14 is being moved back, that is to say downwards.

Furthermore, opposite to the dwell part 45 and the processing part 46 of a cam 27, there is diametrally oppositely placed (that is to say on the other side of the axis of cam 27) a part 47 with a lesser radius, which, at its one end or side is joined up with part 45 by way of a cam face part 48 of changing radius, that is to say its face is not at the same distance from the axis of turning, and at its other side or end is joind up with processing cam face part 46, again by way of a cam face part 48 having a changing radius or changing distance from the axis of turning.

When, after acting on its follower roller 25, cam face part 46 has moved past the same and come clear of follower roller 25, working cam 23 will have so moved that its face part 42 comes up against follower roller 22, this being at a time at which the carriage has slipped downwards as far as it will go and will still be near its lowermost point of motion. At this time the follower rollers 25 at the lower ends of levers 24 will no longer be being forced outwards so that the levers 24 will be generally freed and the tools, together with grippers, will be being forced apart by springs 21 so that the transistor may be dropped into the takeup box.

It is to be noted that for making FIG. 2 clearer for the reader, the radius of the processing cam face part 46 is made very much larger than the radius of the dwell part 45. In fact, however, the radiusses will not be so different as this, because the distance to be moved from the position at which grippers 20 come into play into the position at which tools 19 take effect on the leads is in fact only a question of some millimeters.

Levers 24 are not turningly supported on base-plate 8 itself, but on different ones of bearing levers 28, which are turningly supported on the base-plate. Bearing levers 28 are turningly supported at 29, use being made, for this purpose, of a pin on base-plate 8. The range of turning may be adjusted or limited by way of an adjustment screw 30 in each case, the screw running up against a stop 31 which is fixedly joined to base-plate on operation, the bearing levers 28 with adjustment screws 30 are forced by compression springs 21 against stops 31. By turning adjustment screws 30, the bearing points or axes of turning of levers 24, and, for this reason, of the tool shutting motion 18 of tool supports 16 may undergo adjustment separately from each other and separately from the working motion 15 so that the tools 19 may be shut in the middle under guideway 5 in a way dependent on the desired adjustment.

In a way different to the working example of FIGS. 1 and 2, it is possible to have, in place of two tool shutting cams 27, each having a separate lever 24, a single tool shutting cam symmetrical about a diametral plane stretching in an axial direction, the outline of the cam being for example the same as the outline of the tool shutting cams 27 to be seen in FIG. 2. In this case, on one turn of driving shaft 12, each tool will be moved through two complete shutting motions so that, on the same lines as the working cam 23, the cam has to be symmetrical about a diametral plane or will have to be powered through change-speed gearing.

Account of operation of invention

In the stage of functioning to be seen in FIG. 1, the carriage 14, and, for this reason, tools 19, are the top dead center position of the operation motion. Because of the form of working cam 23, carriage 14 will keep in this position, while tool supports 16 with tools 19 will be moved towards each other by tool shutting cams 27 and levers 24. The right adjustment will have been made of adjustment screw 10 to make certain that tools 19, on being shut, exactly take up the transistor 3 at the front end of chute 2. Because of the design of tool shutting cams 27, tool supports 16 are firstly only moved towards each other to such a degree that leads 6 of transistor 3 are gripped by grippers 20 (for stopping pulling forces acting on the transistor on later bending and cutting operations). Tool supports 16 will be stopped in this position because of the form of tool shutting cams 27, while carriage 14 is now moved forwards in the component direction 4, transistor 3, which is only lightly gripped by spring 7, being taken out of chute 2. After transistor 3 has been taken out of chute 2, while carriage 14 is being moved forwards, tools 19 are moved nearer together so that the leads 6 are firstly bent, each kinked and then cut off to the desired lengths by the cutting tools, not figured: this further motion of tools 19 to be nearer together is produced by rounded corners or nosepieces 32 of tool shutting cam 27, although such a motion together may be naturally produced by having nosepieces on guide faces 26 of tool supports 16, this, however, not being given in the figures. At the end of the forward part of working motion 15, tool supports 16 are freed by levers 24 and parted by compression springs 21 so that leads 6 are freed and the transistor 3, processed and ready to be positioned in the circuit, is dropped downwards into a takeup box (not figured). The pushing out or ejection of the transistors 3 is helped along by guide rails 36, which are fixed to the end of chute so as to be running along (at a higher level than grippers 20) at the two sides of slot or guideway 5 but past its end, running into the range of working motion 15. Nextly, the carriage is moved back when the backwardly directed part of the working motion 5 takes place so that the now parted tools 19 come back to the end of the chute 2 at which the transistors are handed over to them. This stage of motion is to be seen in FIG. 2. When the carriage 14 has got as far as the top dead center position of the working motion 15, the events as noted will be started over again.

In FIG. 2, a door 33 will be seen, which is turningly supported on chute 2 and is moved into a position to the back of the transistor furthest along chute 2. Door 33 is joined up with a lever 34, turningly supported on chute 2 and which is joined up with a driving part 35 able to be turned against the force of a spring (not figured), that is to say in the opposite direction to the direction 4 of transistors 3. When carriage 14 gets near the top dead center position, driving part 35 is moved by tool support 16 so that door 33 is forced into chute 2 against the force of a spring (not figured as well), by which door 33 is forced out of chute 2 when driving part 35 is freed on the forward part of motion of carriage 14 taking place, so that the further transistor 3 will be moved forwards under its own weight into the handing over position, that is to say the position of transfer to the grippers.

I claim:

1. In an apparatus for working leads of electrical components having an inlet unit with a guideway and fixedly supported on a base-plate, two tools designed for operation with said inlet unit and powered by a driving motor, the tools each being positioned on a different one of two tool supports so that they may be moved towards each other for bending and kinking the leads of the said components between them, the leads running into the working path of the tools, which are supported on a carriage designed for a backward and forward working motion, parallel to the inlet unit's guideway and which are able to be moved towards each other for shutting in a direction normal to the inlet direction of the components and in timed relation to the working motion of said carriage, the invention residing in that each tool support has a guide face generally parallel to said working motion of said carriage, the length of the guide faces being at least equal to the size of the working motion, the apparatus further having two levers, turningly supported on said base-plate, each one of these levers running against a different one of said guide faces, and at least one shutting cam designed to be turned by said motor for moving said levers.

2. An apparatus as claimed in claim 1, further having a working cam for driving said carriage and causing the working motion thereof.

3. An apparatus as claimed in claim 2, wherein said working cam has a cam face with a part of greater diameter and a part of lesser diameter, the two cam face parts being joined together by a cam face part of changing diameter.

4. An apparatus as claimed in anyone of claims 1 to 3, wherein the guide faces are turned facing away from the inlet unit and wherein the tool supports are springingly forced away from each other against the levers.

5. An apparatus as claimed in anyone of claims 1 to 3, further having, for each tool support, a guide normal to the working motion.

6. An apparatus as claimed in anyone of claims 1 to 3, having one such single, common tool shutting cam for driving the levers, the cam having a two-ordered symmetry about a diametral plane, two such parts of the working motion for each single turn of the shutting cam taking place.

7. An apparatus as claimed in claim 6, in which the tool shutting cam has opposite dwell parts of great diameter, narrow working parts coming after them in the direction of turning and having a somewhat greater diameter, and joining-up cam parts running between a first one of said dwell cam parts and a working part, which is near to the second one of said dwell parts opposite to the said first dwell part, the joining cam parts being spaced from the axis of turning, the distance from this axis being at one point less than at other points on the cam face.

8. An apparatus as claimed in anyone of claims 1 to 3, having an output shaft on said motor and wherein the two shutting cams are each designed for driving a different one of said levers, said two cams being coaxial with respect to said carriage driving, working cam and to the motor output shaft.

9. An apparatus as claimed in claim 10, in which each tool shutting cam has a dwell cam face part of great diameter and, directly after it in the direction of turning, a narrow working part having a somewhat greater diameter, these two cam parts being joined together by a generally opposite cam part of small diameter, which is joined up with them on the cam's two sides by curved parts of changing diameter, that is to say, on the one side with the dwell and, on the other side, with the working part.

10. An apparatus as claimed in anyone of claims 1 to 3, wherein adjustment of the positions at which the levers come up against the guide faces may be made in relation to the same.

11. An apparatus as claimed in claim 10, further having further levers supported on the base-plate and turningly supporting said first-named levers, said further levers being able to undergo adjustment for changing the positions at said first-named levers.

12. An apparatus as claimed in anyone of claims 1 to 3, having lead grippers for guarding the components against damage by lead-pulling which might otherwise be caused by working on the leads, such grippers being made up of a keeper and an opposite rest, which are movingly supported each on a different one of the tools, the guide faces and/or the tool shutting cams being so formed that at a top dead center position of said working motion nearest to the inlet unit shutting motion takes place till the lead grippers are shut onto the leads.

13. An apparatus as claimed in anyone of claims 1 to 3, wherein the base-plate is movingly supported for motion in relation to the inlet unit in the same direction as the said working motion.

14. An apparatus as claimed in anyone of claims 1 to 3, wherein the inlet unit has the form of a chute with a guideway taking the form of an opening to take up downwardly stretching leads of the said components, the tools only being shut together after each component has been taken clear of the chute.

15. An apparatus as claimed in claim 14, further having a door in the chute for taking up a position to the back of the component nearest the tools and further having an elastically giving part for driving, by way of one of the tools, the door into the chute before the dead center point of the working motion nearest the chute.

16. An apparatus as claimed in claim 14, further having guide rails fixed to the chute and running out therefrom to the two sides of a line continuing the guideway and at a higher level than the tools, into the range of motion of the tools.

17. An apparatus as claimed in claim 15, further having guide rails fixed to the chute and running out therefrom to the two sides of a line continuing the guideway and at a higher level than the tools, into the range of motion of the tools.

* * * * *